(12) United States Patent
Kim et al.

(10) Patent No.: US 11,681,086 B2
(45) Date of Patent: Jun. 20, 2023

(54) DISPLAY DEVICE

(71) Applicant: Samsung Display Co., Ltd., Yongin-si (KR)

(72) Inventors: Sanghyeok Kim, Cheonan-si (KR); Jung-Hun Lee, Hwaseong-si (KR); Sungun Park, Suwon-si (KR); Jihwa Lee, Hwaseong-si (KR); Giljae Choi, Asan-si (KR); Jiwon Han, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 131 days.

(21) Appl. No.: 17/188,730

(22) Filed: Mar. 1, 2021

(65) Prior Publication Data

US 2022/0011489 A1    Jan. 13, 2022

(30) Foreign Application Priority Data

Jul. 8, 2020  (KR) .......................... 10-2020-0084254

(51) Int. Cl.
    *G02B 5/30* (2006.01)
(52) U.S. Cl.
    CPC ................... *G02B 5/3083* (2013.01)
(58) Field of Classification Search
    CPC .. G02B 5/3083; G02B 5/3025; G02B 5/3033; G02F 1/13363; G02F 1/133638; G02F 2202/40; G02F 1/133528; G02F 1/133331; G06F 1/1605
    See application file for complete search history.

(56) References Cited

U.S. PATENT DOCUMENTS

| 2017/0289324 A1* | 10/2017 | Yeo ..................... H04M 1/0277 |
| 2019/0317629 A1* | 10/2019 | Jung ..................... G06F 3/0488 |
| 2020/0185643 A1* | 6/2020 | Moon ............... G02F 1/133308 |
| 2020/0286436 A1 | 9/2020 | Lim |
| 2021/0223607 A1* | 7/2021 | Liu .................. G02F 1/133509 |

FOREIGN PATENT DOCUMENTS

| CN | 106471402 A | * | 3/2017 | ............... G02B 5/30 |
| JP | 2019150952 A | * | 9/2019 | |
| KR | 10-0987283 | | 10/2010 | |
| KR | 10-1754787 | | 7/2017 | |
| KR | 101754787 B1 | * | 7/2017 | |
| KR | 10-2017-0103159 | | 9/2017 | |

\* cited by examiner

*Primary Examiner* — Jia X Pan
(74) *Attorney, Agent, or Firm* — Kile Park Reed & Houtteman PLLC

(57) ABSTRACT

A display device includes an electronic part, a support part including a through hole overlapping the electronic part, a display part disposed above the support part and including a first area overlapping the through hole, and a second area non-overlapping the through hole, the second area being adjacent to the first area, a polarizing plate disposed above the display part and having a transmission axis parallel to a direction, and a pattern optical layer disposed on the polarizing plate and including first phase retardation parts having a first optical axis, and second phase retardation parts having a second optical axis orthogonal to the first optical axis.

19 Claims, 15 Drawing Sheets

DISPLAY DEVICE

CROSS-REFERENCE TO RELATED APPLICATION(S)

This application claims priority to Korean Patent Application No. 10-2020-0084254 under 35 U.S.C. § 119, filed in the Korean Intellectual Property Office on Jul. 8, 2020, the entire contents of which are incorporated herein by reference.

BACKGROUND

1. Technical Field

The disclosure herein relates to a display device including a camera.

2. Discussion of the Related Art

Various types of display devices may be used to provide image information, and the display devices may include an electronic part that receives an external signal or provides an output signal. For example, the electronic part may include a camera, and there is an increasing demand for a display device capable of obtaining a high-quality captured image.

In order to increase the area in which an image may be displayed on the display device, a camera, etc. may be placed in the area where the image may be displayed and accordingly, there may be a need to improve the quality of captured images.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure may provide a display device for improving the capture quality of an image captured by a camera in the direction of a display surface of the display device.

The disclosure also may provide a display device in which image quality deterioration caused by a functional layer included in a display device and optical functional layers of an electronic device to be captured may be improved in case that an image may be captured in a self-portrait (selfie) mode.

An embodiment provides a display device that may include an electronic part, a support part including a through hole overlapping the electronic part, a display part disposed above the support part and including a first area overlapping the through hole, and a second area non-overlapping the through hole, the second area being adjacent to the first area, a polarizing plate disposed above the display part and having a transmission axis parallel to a direction, and a pattern optical layer disposed on the polarizing plate and including first phase retardation parts having a first optical axis and second phase retardation parts having a second optical axis orthogonal to the first optical axis.

In an embodiment, the first optical axis may have an intervening angle of about 45±5° in a positive direction with respect to the transmission axis, and the second optical axis may have an intervening angle of about 45±5° in a negative direction with respect to the transmission axis.

In an embodiment, the pattern optical layer may be a λ/4 phase retarder.

In an embodiment, the pattern optical layer may overlap the first area and non-overlap the second area.

In an embodiment, the pattern optical layer may overlap an entire area of the first area and the second area.

In an embodiment, the first phase retardation parts and the second phase retardation parts may be alternately arranged.

In an embodiment, a total area of the first phase retardation parts and a total area of the second phase retardation parts may be the same.

In an embodiment, each of the first phase retardation parts and the second phase retardation parts may be arranged in a stripe shape.

In an embodiment, each of the first phase retardation parts and the second phase retardation parts may be arranged to be parallel to or orthogonal to the direction.

In an embodiment, each of the first phase retardation parts and the second phase retardation parts may have a square shape in a plan view, and the first phase retardation parts and the second phase retardation parts may be arranged in a mosaic shape.

In an embodiment, the polarizing plate may include a linear polarizing layer, a first phase retardation layer disposed under the linear polarizing layer, and a second phase retardation layer disposed between the first phase retardation layer and the linear polarizing layer, and the first phase retardation layer may be a λ/4 phase retarder, and the second phase retardation layer may be a λ/2 phase retarder.

In an embodiment, the display device may further include a window including a cover layer, and a protective layer disposed on the cover layer and having a phase retardation of about 5000 nm or more.

In an embodiment, the display device may further include a shock absorbing layer disposed on an upper side of the pattern optical layer and having a phase retardation of about 5000 nm or more.

In an embodiment, the polarizing plate may be directly disposed on the display part.

In an embodiment, the pattern optical layer may be directly disposed on the polarizing plate.

In an embodiment, a display device may include a display part, a camera disposed below the display part and capturing an image in a front direction of the display part, a polarizing plate disposed above the display part and including a linearly polarizing layer having a transmission axis in a direction, and a pattern optical layer overlapping the camera and disposed above the polarizing plate, the pattern optical layer including first phase retardation parts having a first optical axis, and second phase retardation parts having a second optical axis orthogonal to the first optical axis.

In an embodiment, the first optical axis may have an intervening angle of about 45±5 degrees in a positive direction with respect to the transmission axis, and the second optical axis may have an intervening angle of about 45±5 degrees in a negative direction with respect to the transmission axis.

In an embodiment, the pattern optical layer may be a λ/4 phase retarder.

In an embodiment, the first phase retardation parts and the second phase retardation parts may be alternately arranged.

In an embodiment, a total area of the first phase retardation parts and a total area of the second phase retardation parts may be the same.

BRIEF DESCRIPTION OF THE DRAWINGS

The accompanying drawings are included to provide a further understanding of the embodiments, and are incorporated in and constitute a part of this specification. The drawings illustrate the embodiments and explain them together with the description. In the drawings.

DETAILED DESCRIPTION OF THE EMBODIMENTS

Figure 1:
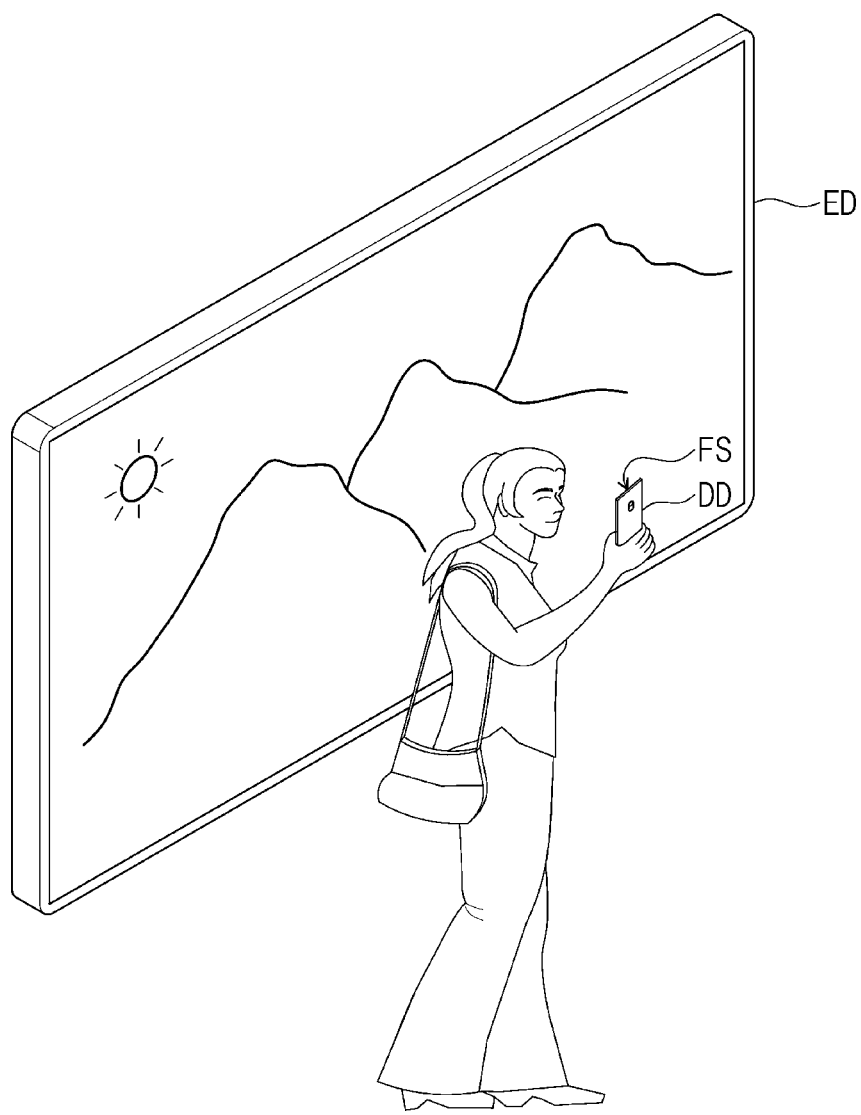
FIG. 1 is a schematic diagram illustrating an example of use of a display device according to an embodiment.

Various modifications are possible in various embodiments and specific embodiments are illustrated in drawings and related detailed descriptions are listed. However, these disclosures do not limit various embodiments to a specific embodiment and it should be understood that the disclosure may cover all the modifications, equivalents, and/or replacements of the embodiments provided they come within the scope of the appended claims and their equivalents.

In this application, when it is mentioned that a component (or an area, a layer, a part, etc.) is referred to as being "on", "connected to" or "combined to" another component, this means that the component may be directly on, connected to, or combined to the other component or a third component therebetween may be present.

On the other hand, "directly disposed" in the application may mean that there may be no layer, film, region, plate or the like added between the portion such as layer, film, region, plate or the like and another portion. For example, "directly disposed" may mean disposing without additional members such as adhesive members between two layers or two members.

Like reference numerals refer to like elements. In the drawings, the thicknesses, proportions, and dimensions of components may be exaggerated for effective description.

"And/or" includes all of one or more combinations defined by related components. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "first" and "second" may be used herein to describe various components but these components should not be limited by these terms. The above terms may be used only to distinguish one component from another. For example, a first component may be referred to as a second component and vice versa without departing from the scope of the disclosure. The terms of a singular form may include plural forms unless otherwise specified.

Terms such as "below", "the lower side", "on", and "the upper side" may be used to describe a relationship of configurations shown in the drawing. The terms may be described as a relative concept based on a direction shown in the drawing. In the application, "disposed on" may refer to a case in which one may be disposed on the upper portion as well as the lower portion of any one member.

The term "overlap" may include layer, stack, face or facing, extending over, covering or partly covering or any other suitable term as would be appreciated and understood by those of ordinary skill in the art. "Non-overlap" and the like may include apart from or set aside from or offset from and any other suitable equivalents as would be appreciated and understood by those of ordinary skill in the art.

Unless otherwise defined or implied, all terms (including technical and scientific terms) used herein have the same meaning as terms commonly understood by those skilled in the art to which this disclosure belongs. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In various embodiments, the terms "include," "comprise," "has," "including," "having", and "comprising" specify a property, a region, a fixed number, a step, a process, an element and/or a component but do not exclude other properties, regions, fixed numbers, steps, processes, elements and/or components.

"About", "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Hereinafter, a display device according to an embodiment will be described with reference to the drawings.

Figure 2:
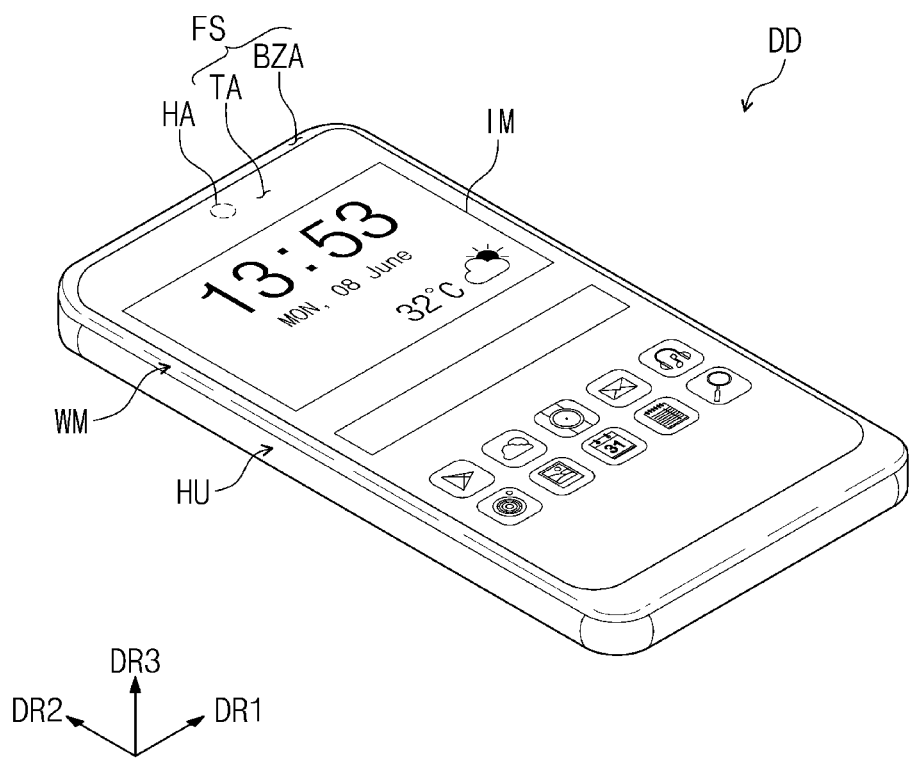
FIG. 2 is a schematic perspective view of a display device according to an embodiment.
Figure 3:
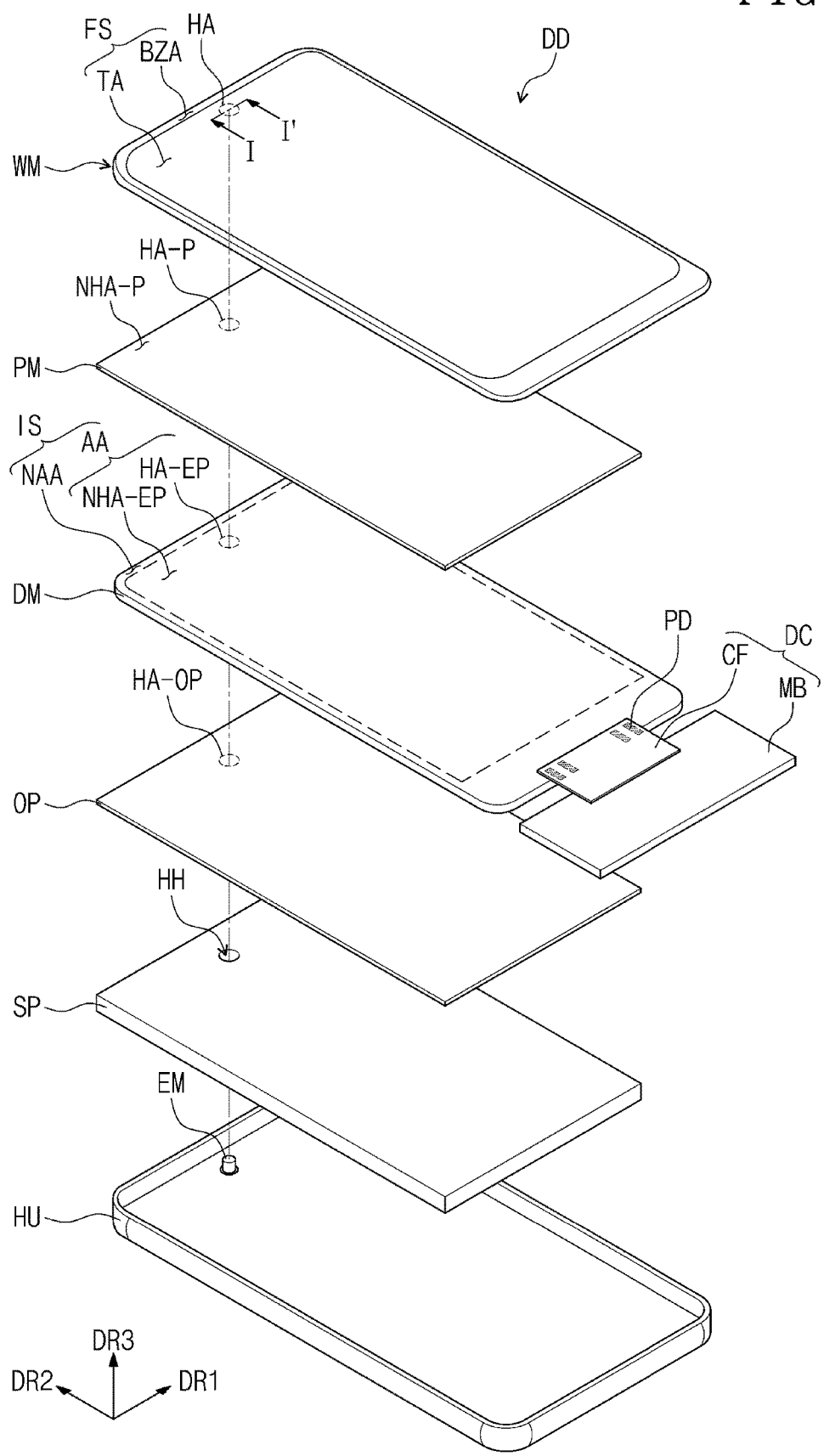
FIG. 3 is an exploded schematic perspective view of a display device according to an embodiment.
Figure 4:
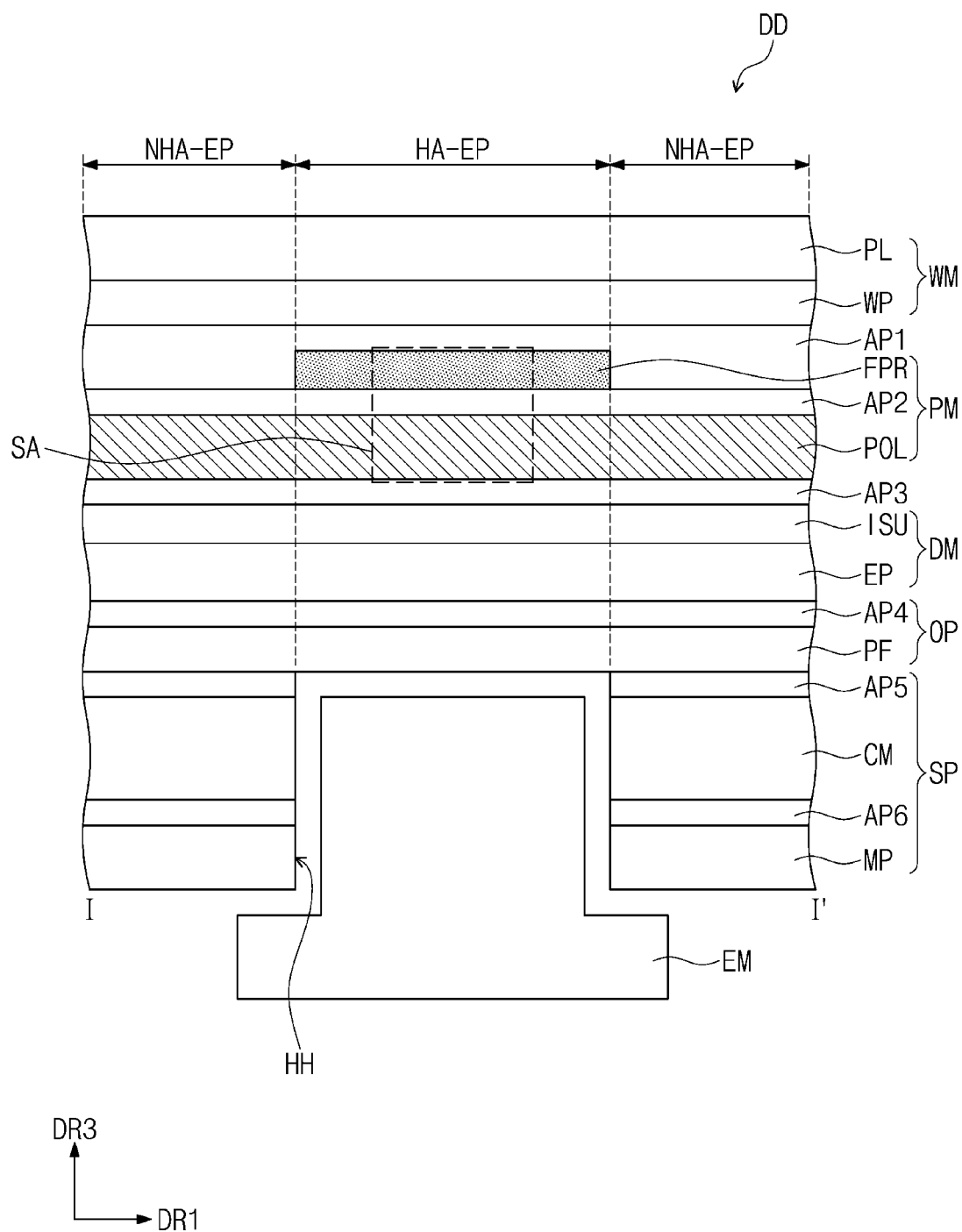
FIG. 4 is a schematic cross-sectional view of a part of a display device according to an embodiment.

FIG. 1 is a schematic diagram illustrating an example of using a display device according to an embodiment. FIG. 2 is a schematic perspective view of a display device according to an embodiment, and FIG. 3 is an exploded schematic perspective view of a display device according to an embodiment. FIG. 4 is a schematic cross-sectional view of a display device of an embodiment. FIG. 4 is a cross-sectional view illustrating a portion of the display device, which corresponds to line I-I' of FIG. 3.

FIG. 1 illustrates an example of using a display device DD according to an embodiment. FIG. 1 shows an example in which a user captures an image in front of an electronic device ED using the display device DD according to an embodiment, and in particular, shows an example in which an image may be captured so that the upper surface FS of the display device DD may be directed toward the electronic device ED. Specifically, FIG. 1 shows an example of using the display device DD to capture an image in a self-capture mode (e.g., a selfie).

In the example of use illustrated in FIG. 1 and the like, the electronic device ED may be a large electronic device such as a television, a monitor, or an external billboard. Further, the display device DD may be a small or medium-sized electronic device such as a smart phone, a personal computer, a notebook computer, a personal digital terminal, a car navigation system, or a game console. The listed examples of the electronic device ED and the display device DD are provided as examples only, and other electronic devices may be used without departing from the disclosure. For example, small or medium-sized electronic devices such as smart phones, personal computers, notebook computers, personal digital terminals, car navigation systems, or game consoles may also be used as the electronic device ED.

As shown in FIG. 1, in case capturing video in a self-capture mode, the quality of the captured image may be deteriorated due to optical interference in functional layers (protective layers, polarizing plates, optical parts, etc.) disposed on the front surface of the electronic part EM and the optical functional layers (polarizing plate, etc.) included in the electronic device ED. For example, due to an optical interference phenomenon in the functional layers included in the display device DD and the optical functional layers included in the electronic device ED, the image quality deterioration phenomenon referred to as rainbow mura or color shift problem in which a desired color is not fully realized may occur.

The display device DD according to an embodiment may include a transmission area TA and a bezel area BZA. The image IM may be displayed in the transmission area TA of the display device DD. In FIG. 2, a clock and icons are shown as an example of the image IM. The transmission area TA and the bezel area BZA of the display device DD shown in FIG. 2 may correspond to the transmission area TA and the bezel area BZA of the window WM.

The display device DD may display the image IM in the direction of the third direction axis DR3 on a display surface parallel to a plane defined by the first direction axis DR1 and the second direction axis DR2. The display surface on which the image IM may be displayed may correspond to the front surface of the display device DD and may correspond to the upper surface FS of the window WM. The display device DD may have a three-dimensional shape having a thickness in the direction of the third direction axis DR3, which may be a direction perpendicular to a plane defined by the first direction axis DR1 and the second direction axis DR2.

In this application, an upper surface (or front surface) and a lower surface (or rear surface) of each element may be defined based on the direction in which the image IM may be displayed. The upper surface and the lower surface may be opposing to each other with respect to the third direction axis DR3, and a normal direction of each of the upper surface and the lower surface may be parallel to the third direction axis DR3. A direction indicated by the first to third direction axes DR1, DR2, and DR3 may be a relative concept and may be converted to another direction. Hereinafter, first to third directions refer to the same reference numerals of the respective directions that the first to third direction axes DR1, DR2, and DR3 indicate.

The transmission area TA may have a quadrangular shape parallel to a plane defined by the first direction axis DR1 and the second direction axis DR2. However, this is illustrated by way of example, and the transmission area TA may have various shapes and is not limited to the embodiment(s) shown.

The bezel area BZA may be adjacent to the transmission area TA. The bezel area BZA may surround the transmission area TA. However, this is illustrated by way of example, and the bezel area BZA may be disposed adjacent to a side of the transmission area TA, and in another embodiment the bezel area BZA may be omitted.

In an embodiment, the display device DD may be flexible. "Flexible" means a property that can be bent, and may include all types from a fully folded structure to a structure that can be bent at a level of several nanometers. For example, the display device DD may be a curved display device or a foldable display device. Also, the display device DD may be rigid.

The display device DD according to an embodiment may include an electronic part EM, a display part DM disposed on the electronic part EM, and a polarizing part PM disposed on the display part DM. Also, the polarizing part PM may include a polarizing plate POL and a pattern optical layer FPR disposed on the polarizing plate POL. A support part SP may be disposed between the electronic part EM and the display part DM, and a through hole HH overlapping the electronic part EM may be defined in the support part SP. The display device DD according to an embodiment may further include a window WM disposed on the display part DM. Also, the display device DD of an embodiment may include a panel support part OP and a housing HU. In the display device DD according to an embodiment illustrated in FIGS. 2 and 3, the window WM and the housing HU may be combined to form the appearance of the display device DD.

In the display device DD according to an embodiment, the window WM may be disposed on the polarizing part PM. The window WM may be disposed on the display part DM to cover the front surface IS of the display part DM. The window WM may include a cover layer WP and a protective layer PL disposed above the cover layer WP.

The cover layer WP may be a substrate including an optically transparent insulating material. The cover layer WP may have ductility. For example, the cover layer WP may include a polymer film, a substrate including a polymer material, a thin glass substrate, or a combination thereof. The cover layer WP may correspond to a substrate having no phase difference or very low phase difference.

The protective layer PL may be disposed above the cover layer WP to protect the cover layer WP from an external environment. Although not shown in the drawings, an adhesive layer (not shown) may be further disposed between the cover layer WP and the protective layer PL. The adhesive layer (not shown) may be an optically clear adhesive layer. The protective layer PL may be a layer exposed to the outside from the display device DD.

The window WM may include an upper surface FS exposed to the outside. The upper surface FS of the display device DD may be substantially defined by the upper surface FS of the window WM. The transmission area TA on the upper surface FS of the window WM may be an optically transparent area. The transmission area TA may have a shape corresponding to the active area AA of the display part DM. For example, the transmission area TA may overlap the front surface or at least a portion of the active area AA. The image IM displayed in the active area AA of the display part DM may be visually viewed from the outside through the transmission area TA.

In the upper surface FS of the window WM, the bezel area BZA may have a relatively low light transmittance compared to the transmission area TA. The shape of the transmission area TA may be defined by the bezel area BZA. The bezel area BZA may be adjacent to the transmission area TA and may surround the transmission area TA.

The bezel area BZA may have a color. In case that the cover layer WP is provided as a glass or polymer substrate, the bezel area BZA may be a color layer printed or deposited on one surface of the glass or polymer substrate. In other embodiments, the bezel area BZA may be formed by coloring a corresponding area of a glass or polymer substrate.

The bezel area BZA may cover the peripheral area NAA of the display part DM so as to prevent the peripheral area NAA from being visually recognized from the outside. This is illustrated by way of example, and in the window WM according to an embodiment, the bezel area BZA may be omitted.

The hole area HA may be defined in the transmission area TA of the window WM. The hole area HA of the window may be defined as the hole area HA of the display device DD.

The protective layer PL disposed on the cover layer WP may be a layer having a phase retardation of about 5000 nm or more. For example, in an embodiment, the phase retardation of the protective layer PL may be about 8000 nm or more. By setting the phase retardation of the protective layer PL to about 5000 nm or more in an embodiment, when capturing an image using the electronic part EM placed under the protective layer PL, excellent capturing quality can be obtained by minimizing optical interference caused by the protective layer PL.

In the application, the phase retardation (also referred to as phase difference) may indicate refractive index anisotropy in three orthogonal axes, and may be defined as the phase retardation $R_{th}$ in the thickness direction, and the phase retardation $R_th$ may be defined as in Equation (1) below.

$$\text{Phase retardation } (R_{th}) = \{(|n_x - n_y|/2) - n_z\} \times d \quad (1)$$

In Equation 1, $n_x$ may be the refractive index in the uniaxial (x-axis) direction in the plane of the layer or film, $n_y$ may be the refractive index of the layer or film in the other axis (y axis) direction orthogonal to one axis, $n_z$ may be the refractive index in the z-axis direction, which may be the thickness direction, and d may correspond to the thickness of the layer or film. The phase retardation value may represent a value at a specific wavelength, and for example, the phase retardation value may be a value at about a 550 nm wavelength.

The protective layer PL having a phase retardation may have a difference between an elongation rate in one axis direction of one axis (x axis) and the other axis (y axis) and an elongation rate in the other axis direction. A direction in which the elongation rate is relatively high may be defined as the optical axis of the protective layer PL. The optical axis of the protective layer PL may form an angle of about 45±5° with the transmission axis PP-TX (see FIG. 7) of the polarizing plate POL to be described later.

The protective layer PL may include an elongated polyethylene terephthalate (PET) film having a phase retardation of about 5000 nm or more. However, the embodiment is not limited thereto. In an embodiment, the thickness of the protective layer PL may be about 40 or more. For example, the protective layer PL may be a polyethylene terephthalate (PET) film having a thickness of about 80 μm or more and a phase retardation of about 5000 nm or more.

The display device DD of an embodiment may include a hole area HA overlapping the through hole HH defined in the support part SP. The hole area HA may be an area overlapping the electronic part EM. For example, the hole area HA may be an area in which a camera or the like for capturing an external subject may be disposed, or an area in which an optical sensor for light detection may be disposed. For example, in the display device DD of an embodiment, the electronic part EM may be a camera. For example, in the display device DD of an embodiment, the electronic part EM may be a camera disposed with a lens facing the upper surface FS of the display device DD in order to capture an image in a self-capture mode.

The display device DD of an embodiment may include a display part DM disposed under the window WM. The display part DM may include a display panel EP and a sensor layer ISU. The display part DM may include an active area AA in which an image IM may be displayed and a peripheral area NAA adjacent to the active area AA. For example, the front surface IS of the display part DM may include an active area AA and a peripheral area NAA. The active area AA may be an area activated according to an electrical signal.

The peripheral area NAA may be adjacent to the active area AA. The peripheral area NAA may surround the active area AA. A driving circuit or driving wiring for driving the active area AA may be disposed in the peripheral area NAA.

In the peripheral area NAA, various signal lines, pads PD, or electronic elements for providing an electrical signal to the active area AA may be disposed. The peripheral area NAA may be covered by the bezel area BZA and not be visible from the outside.

The display part DM may include a first area HA-EP and a second area NHA-EP. The first area HA-EP may be an area that overlaps the through hole HH, and the second area NHA-EP may be an area that may be non-overlapping of the through hole HH and may be adjacent to the first area HA-EP. The first area HA-EP may correspond to the hole area HA.

The second area NHA-EP may surround at least a portion of the first area HA-EP. The first area HA-EP may be a portion that may be spaced apart from the peripheral area NAA and defined within the active area AA.

The first area HA-EP may be a portion overlapping the electronic part EM. The first area HA-EP may be an area corresponding to the through hole HH, and the through hole HH may overlap the active area AA and may be spaced apart from the peripheral area NAA on a plane.

The active area AA of the display part DM may include a first area HA-EP and a second area NHA-EP. The display part DM may display the image IM in the entire first area HA-EP and second area NHA-EP.

The display device DD may include a circuit substrate DC electrically connected to the display part DM. The circuit substrate DC may include a flexible substrate CF and a main board MB. The flexible substrate CF may include an insulating film and conductive wires mounted on the insulating film. The conductive wires may be connected to the pads PD to electrically connect the circuit substrate DC and the display part DM.

In an embodiment, the flexible substrate CF may be assembled in a curved state. Thus, the main board MB may be disposed on the rear surface of the display part DM so that it can be stably received in the space provided by the housing HU. For example, the main board MB may be bent toward the rear surface of the display part DM and may be disposed below the support part SP. In an embodiment, the flexible substrate CF may be omitted, and in this case, the main board MB may be directly connected to the display part DM.

The main board MB may include signal lines and electronic elements not shown. The electronic elements may be connected to the signal lines and electrically connected to the display part DM. The electronic elements may generate various electrical signals, for example, a signal for generating the image IM or a signal for detecting an external input, or process detected signals. The main board MB may be provided in plurality corresponding to each of electrical signals for generation and processing, and is not limited to the embodiment shown.

In the display part DM, the display panel EP may include a display element layer including an organic light emitting element, a quantum dot light emitting element, a micro LED light emitting element, or a nano LED light emitting element. For example, the display panel EP may include a display element layer and a sealing layer disposed on the display element layer. The sealing layer may include at least one inorganic layer and at least one organic layer.

The sensor layer ISU may be disposed on the display panel EP. The sensor layer ISU may detect an external input applied from the outside. The external input may be a user input. The user input may include various types of external inputs such as a part of the user's body, light, heat, pen, or pressure.

The sensor layer ISU may be formed on the display panel EP through a continuous process. The sensor layer ISU may be expressed as being directly disposed on the display panel EP. "Directly disposed" may mean that a third component may not be disposed between the sensor layer ISU and the display panel EP. For example, a separate adhesive member may not be disposed between the sensor layer ISU and the display panel EP. For example, the sensor layer ISU may be directly disposed on a sealing layer (not shown) of the display panel EP. An embodiment is not limited thereto, and an adhesive member (not shown) may be further disposed between the sensor layer ISU and the display panel EP.

In the display device DD of an embodiment, the polarizing part PM may be disposed on the display part DM. The polarizing part PM may be disposed between the display part DM and the window WM. In an embodiment, the polarizing part PM may include a polarizing plate POL and a pattern optical layer FPR. The polarizing part PM may further include an adhesive layer AP2 disposed between the polarizing plate POL and the pattern optical layer FPR. The adhesive layer AP2 may be an optically transparent adhesive layer, but embodiments are not limited thereto. In an embodiment, the adhesive layer AP2 may be omitted and the pattern optical layer FPR may be directly disposed on the polarizing plate POL.

In an embodiment, adhesive layers AP1 and AP3 may be further disposed between the polarizing part PM and the window WM and between the display part DM and the polarizing part PM, respectively. The adhesive layers AP1 and AP3 may be disposed between the pattern optical layer FPR of the polarizing part PM and the cover layer WP of the window WM, and between the polarizing plate POL and the display part DM, respectively.

Figure 5:
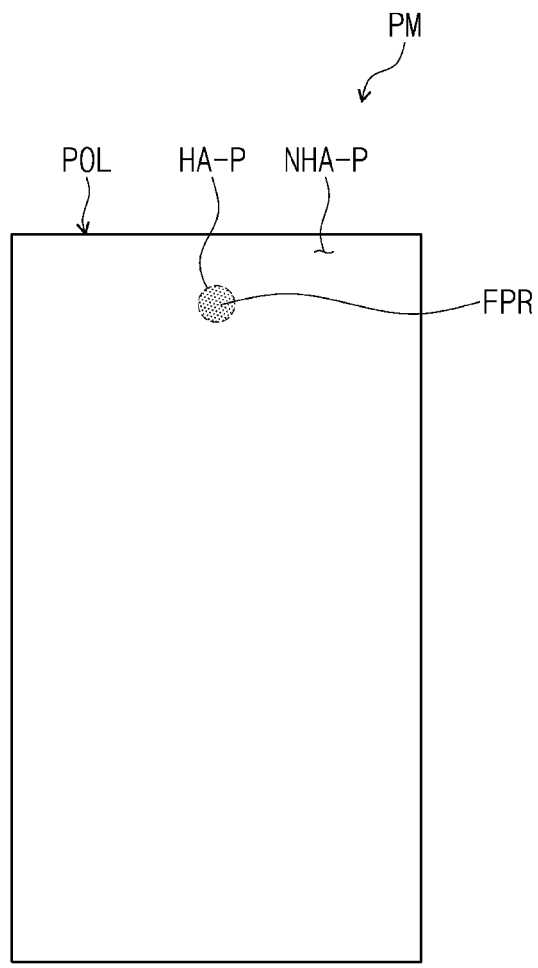
FIG. 5 is a schematic plan view showing a polarizing part according to an embodiment.
Figure 5:
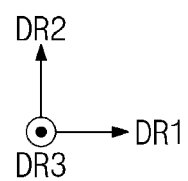
Figure 6:
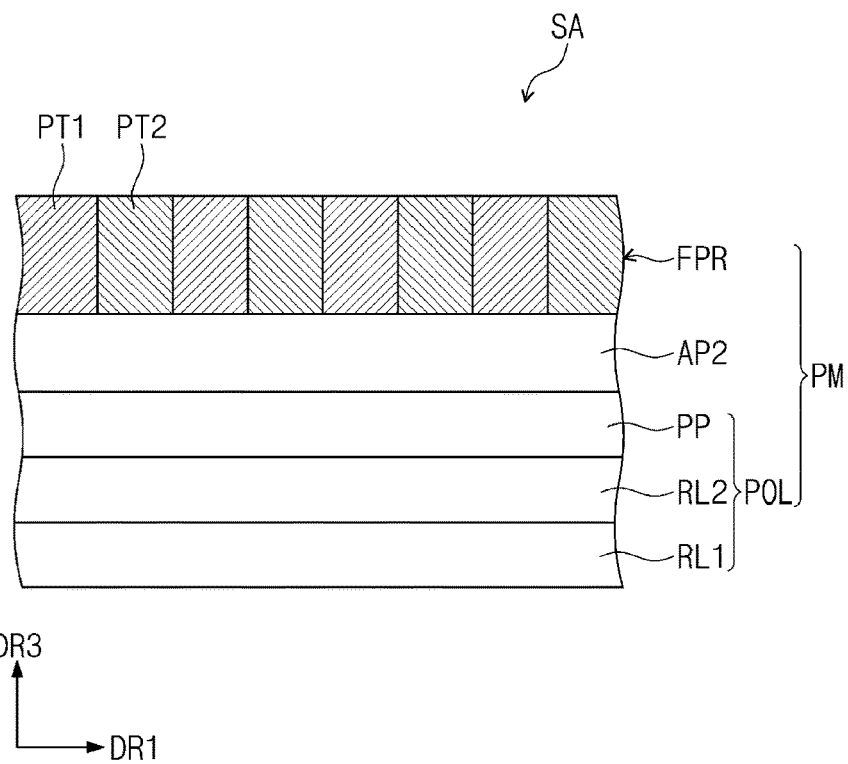
FIG. 6 is a schematic cross-sectional view showing a part of a polarizing part according to an embodiment.
Figure 7:
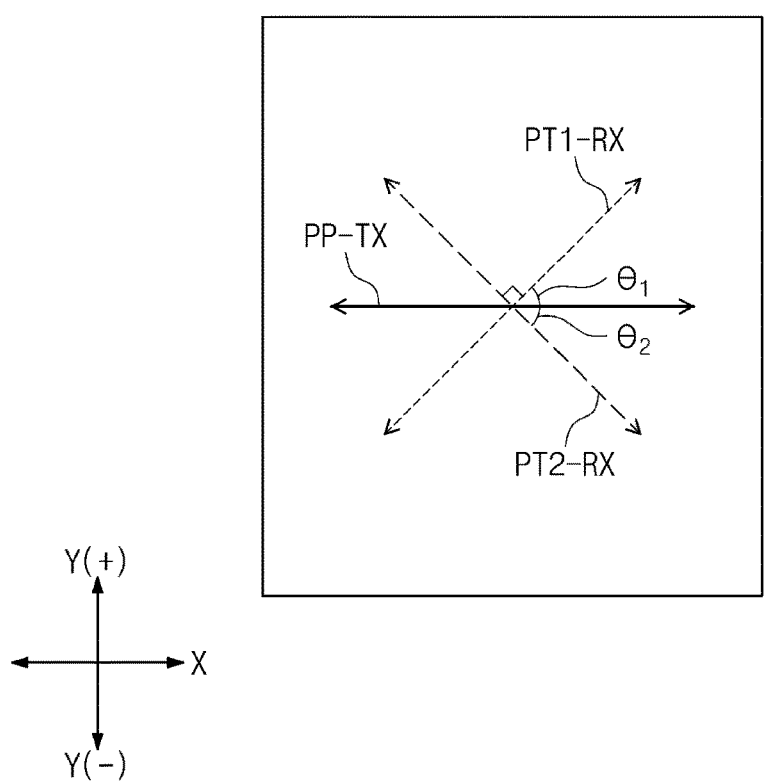
FIG. 7 is an image schematically illustrating a relationship between optical axes in a display device according to an embodiment.
Figure 8:
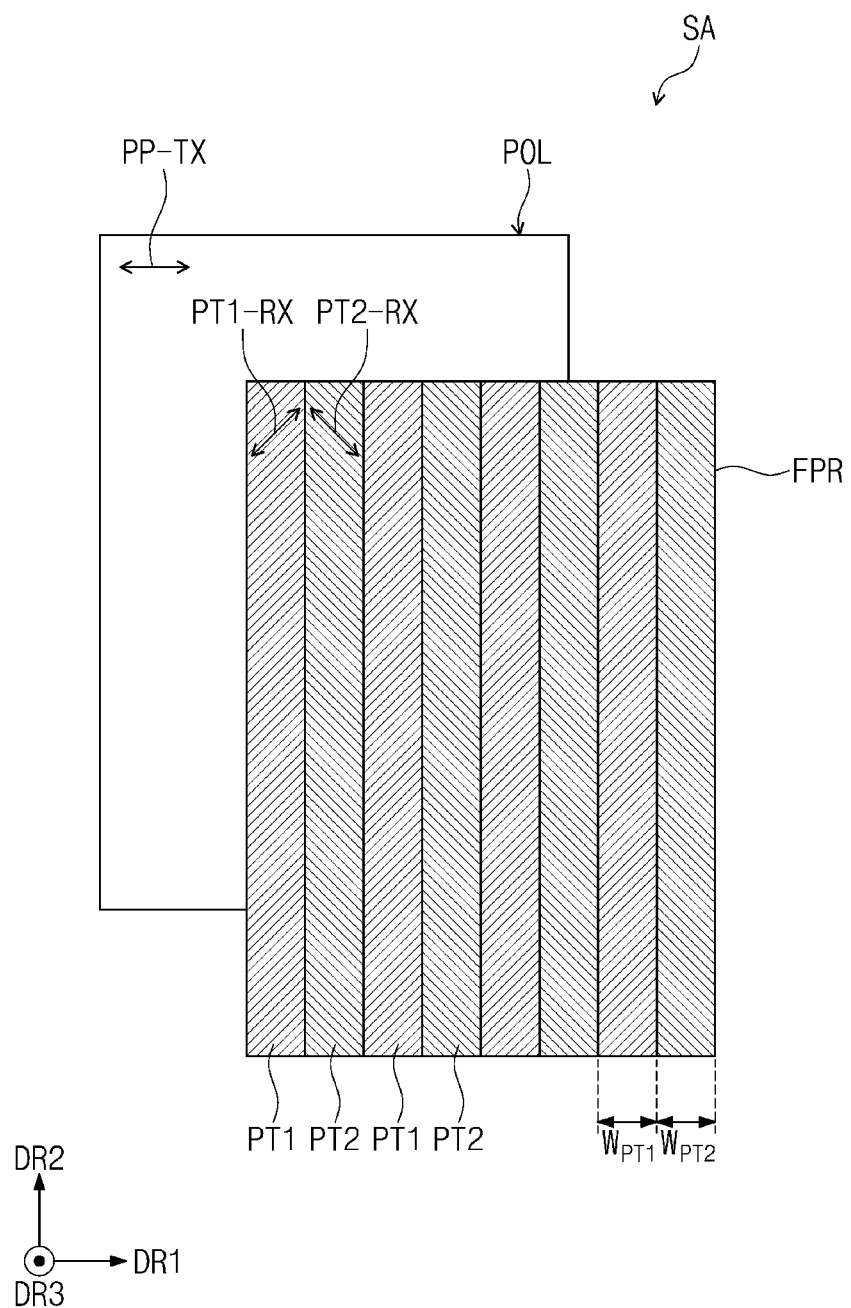
FIG. 8 is an exploded schematic perspective view showing a part of a polarizing part according to an embodiment.

FIG. 5 is a schematic plan view of a polarizing part that may be included in a display device of an embodiment, and FIG. 6 is a schematic cross-sectional view of a polarizing part included in a display device of an embodiment. FIG. 7 is a diagram schematically illustrating a relationship between optical axes in a polarizing part included in a display device of an embodiment. FIG. 8 is an exploded schematic perspective view of a part of a polarizing part according to an embodiment. FIGS. 6 and 8 are views each showing an area SA of FIG. 4.

Referring to FIGS. 4 and 5, the polarizing part PM that may be included in the display device DD of an embodiment may include a polarizing plate POL and a pattern optical layer FPR stacked in the third direction DR3. In the display device DD of an embodiment, the pattern optical layer FPR may overlap the first area HA-EP of the display part DM. In an embodiment, the pattern optical layer FPR may overlap the first area HA-EP and non-overlap the second area NHA-EP. For example, the pattern optical layer FPR may overlap the entire through hole HH defined in the support part SP. The pattern optical layer FPR may overlap the electronic part EM that may be at least partially inserted into the through hole HH.

When viewed on a plane defined by the first direction axis DR1 and the second direction axis DR2, the polarizing part PM may include a polarization hole area HA-P and a polarization peripheral area NHA-P. The polarization hole area HA-P may correspond to the first area HA-EP of the display part DM, and the polarization peripheral area NHA-P may be a part corresponding to the second area NHA-EP of the display part DM.

The polarizing part PM according to an embodiment may have a structure in which the polarizing plate POL and the pattern optical layer FPR may be stacked in the polarization hole area HA-P, and may have a structure composed of a polarizing plate POL without a pattern optical layer FPR in the polarization peripheral area NHA-P.

Referring to FIGS. 4 to 8, the polarizing plate POL that may be included in the display device DD of an embodiment may have a transmission axis PP-TX extending in a direction. The polarizing plate POL may include a linear polarizing layer PP. The linear polarizing layer PP may be an optical layer that linearly polarizes the provided light in one direction. The linear polarizing layer PP may be a film-type linear polarizer including an elongated polymer film. For example, the elongated polymer film may be an elongated polyvinylalcohol based film.

The linear polarizing layer PP may be prepared by adsorbing a dichroic dye on an elongated polymer film. For example, the linear polarizing layer PP may be prepared by adsorbing iodine to an elongated polyvinyl alcohol film. A direction in which the polymer film may be elongated may be an absorption axis of the linear polarizing layer PP, and a direction perpendicular to the elongated direction may be a transmission axis of the linear polarizing layer PP. In an embodiment, the transmission axis PP-TX of the polarizing plate POL may be defined as the transmission axis of the linear polarizing layer PP. However, embodiments are not limited thereto, and the polarization direction can be changed by other optical functional layers included in the polarizing plate POL. The transmission axis of the linear polarizing layer PP may not coincide with the transmission axis PP-TX of the polarizing plate POL.

Further, the polarizing plate POL may include a first phase retardation layer RL1 and a second phase retardation layer RL2 disposed under the linear polarizing layer PP. The second phase retardation layer RL2 may be disposed between the first phase retardation layer RL1 and the linear polarizing layer PP. Each of the first phase retardation layer RL1 and the second phase retardation layer RL2 may be an optical layer delaying the phase of light provided. The first phase retardation layer RL1 may be a λ/4 phase retarder, and the second phase retardation layer RL2 may be a λ/2 phase retarder.

The first phase retardation layer RL1 may have optical anisotropy, and may change a polarization state of light incident on the first phase retardation layer RL1. For example, the light transmitted through the linear polarizing layer PP and provided to the first phase retardation layer RL1 may be changed from the linearly polarized state to the circularly polarized state. The light provided to the first phase retardation layer RL1 in a circularly polarized state may be changed to a linearly polarized state. For example, in case that the wavelength of light transmitted through the linear polarizing layer PP and provided to the first phase retardation layer RL1 is about 550 nm, light transmitted through the first phase retardation layer RL1 may have a phase delay value of about 137.5 nm.

Also, the second phase retardation layer RL2 may be an optical layer that delays the phase of the provided light by λ/2. For example, in case that the wavelength of light transmitted through the linear polarizing layer PP and provided to the second phase retardation layer RL2 is about 550 nm, the light transmitted through the second phase retardation layer RL2 may have a phase retardation value of about 275 nm. Also, the second phase retardation layer RL2 may change a polarization state of incident light. The polarization direction of linearly polarized light incident from the linear polarizing layer PP to the second phase retardation layer RL2 may be changed.

In the polarizing plate POL of an embodiment, the first phase retardation layer RL1 and the second phase retardation layer RL2 may each be in the form of a liquid crystal coating layer. The first phase retardation layer RL1 and the second phase retardation layer RL2 may be a liquid crystal coating layer made using a reactive liquid crystal monomer. The first phase retardation layer RL1 and the second phase retardation layer RL2 may be manufactured by coating a reactive liquid crystal monomer, aligning them, and polymerizing them.

The first phase retardation layer RL1 and the second phase retardation layer RL2 may each be in the form of an elongated film. The first phase retardation layer RL1 and the second phase retardation layer RL2 may be formed by biaxially elongating a film.

The display device DD of an embodiment may include a pattern optical layer FPR disposed on a polarizing plate POL. The pattern optical layer FPR may include first phase retardation parts PT1 having a first optical axis PT1-RX and second phase retardation parts PT2 having a second optical axis PT2-RX. The first optical axis PT1-RX and the second optical axis PT2-RX may be orthogonal to each other.

The first optical axis PT1-RX may have an intervening angle θ1 of about 45±5° in the positive direction with respect to the transmission axis PP-TX of the polarizing plate POL, and the second optical axis PT2-RX may have an intervening angle θ2 of about 45±5° in a negative direction with respect to the transmission axis PP-TX of the polarizing plate POL. FIG. 7 shows the relationship between the transmission axis PP-TX of the polarizing plate POL, the first optical axis PT1-RX of the first phase retardation part PT1, and the second optical axis PT2-RX of the second phase retardation part PT2, which may be illustrated on a plane defined by the X-axis X and the Y-axis (Y(+) and Y(−)). The X-axis X and the Y-axis (Y(+) and Y(−)) may be orthogonal to each other, and "Y(+)" refers to a direction that changes in a positive direction from the X-axis X, and "Y(−)" may refer to a direction that changes in a negative direction from the X-axis X. In FIG. 7, the plane defined by the X-axis X and the Y-axis (Y(+) and Y(−)) may be in parallel with a plane defined by the first direction axis DR1 and the second direction axis DR2 in this application. For example, the X-axis X may be parallel to either the first direction axis DR1 or the second direction axis DR2. However, the embodiment is not limited thereto, and the X-axis X may not be parallel to the first direction axis DR1 and the second direction axis DR2 and may represent an arbitrary direction.

For example, in an embodiment, in case that the first optical axis PT1-RX has an intervening angle θ1 of about 45±5° in the positive direction with respect to the transmission axis PP-TX of the polarizing plate POL, this means that the first optical axis PT1-RX may be inclined in the Y(+) direction based on the X axis X. In case that the second optical axis PT2-RX having an intervening angle θ2 of about 45±5° in the negative direction with respect to the transmission axis PP-TX of the polarizing plate POL, this means that the second optical axis PT2-RX may be inclined in the Y(−) direction based on the X axis X.

In an embodiment, the pattern optical layer FPR may be a λ/4 phase retarder. For example, in an embodiment, the pattern optical layer FPR may be a λ.4 phase retarder patterned to have optical axes in different directions. The first optical axis PT1-RX of the first phase retardation part PT1 and the second optical axis PT2-RX of the second phase retardation part PT2 may each represent a slow axis of a λ/4 phase retarder.

FIGS. 6 and 8 are a cross-sectional view and an exploded perspective view showing a portion corresponding to the area "SA" in FIG. 4, respectively. Referring to FIGS. 6 and 8, the pattern optical layer FPR included in the polarizing part PM according to an embodiment may include a first phase retardation part PT1 and a second phase retardation part PT2 that may be alternately and repeatedly arranged. In an embodiment, the pattern optical layer FPR may include a first phase retardation part PT1 and a second phase retardation part PT2 that may be patterned in a stripe shape extending in one direction. Each of the first phase retardation parts PT1 and the second phase retardation parts PT2 patterned in a stripe shape may be arranged so as to be parallel to one direction of the transmission axis PP-TX of the polarizing plate POL or perpendicular to one direction of the transmission axis PP-TX of the polarizing plate POL.

FIG. 8 shows a first phase retardation part PT1 and a second phase retardation part PT2 patterned to extend in a direction orthogonal to the transmission axis PP-TX of the polarizing plate POL. In FIG. 8, the transmission axis PP-TX of the polarizing plate POL is shown to be parallel to the first direction axis DR1, but this is illustrative and the embodiment is not limited thereto.

In an embodiment shown in FIG. 8, each of the first phase retardation parts PT1 and the second phase retardation parts PT2 may have a stripe shape patterned in a direction parallel to the second direction axis DR2, and the first phase retardation parts PT1 and the second phase retardation parts PT2 may be alternately arranged in the direction of the first direction axis DR1.

In an embodiment, the width $W_{PT1}$ of the first phase retardation part PT1 and the width $W_{PT2}$ of the second phase retardation part PT2, which may be patterned to have different optical axes, may be substantially the same. In the entire pattern optical layer FPR on a plane, the total area of the first phase retardation parts PT1 and the total area of the second phase retardation parts PT2 may be substantially the same.

Figure 9:
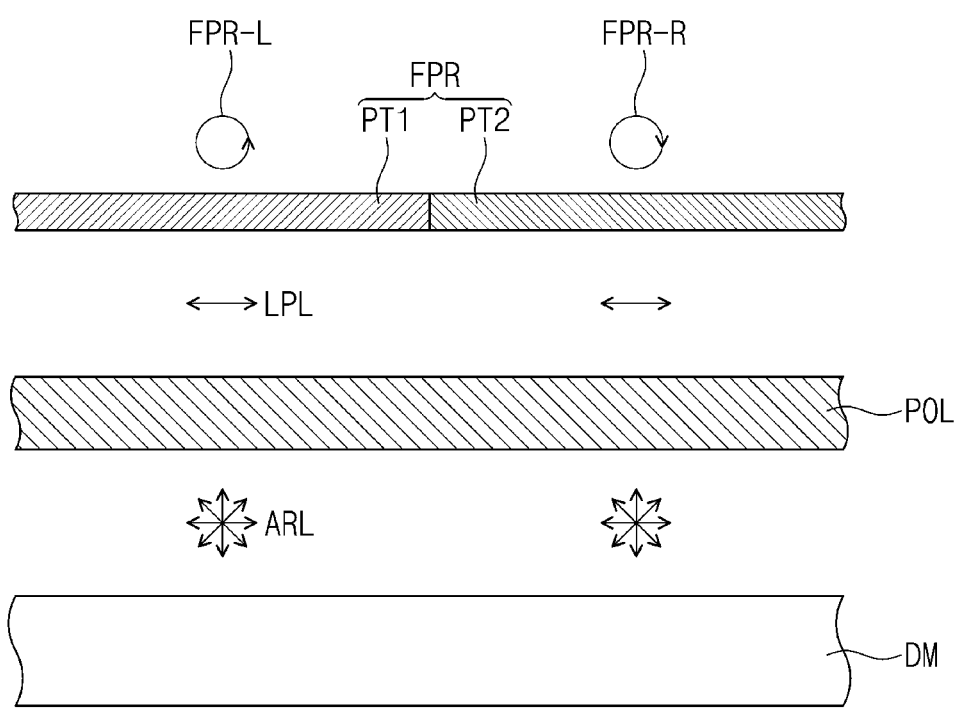
FIG. 9 is a diagram schematically illustrating a light conversion relationship in a display device according to an embodiment.

FIG. 9 is a diagram schematically illustrating a light conversion relationship in a display device DD according to an embodiment. Referring to FIG. 9, light ARL emitted from the display part DM may not be filtered and may be diffused in all directions and may be provided to the polarizing plate POL. The light LPL passing through the polarizing plate POL may be polarized in a direction parallel to the transmission axis in one direction, and may be linearly polarized, and may be incident to the pattern optical layer FPR. After that, the light passing through the first phase retardation part PT1 of the pattern optical layer FPR may be emitted as left circularly polarized light FPR-L, and the light passing through the second phase retardation part PT2 may be emitted as right circularly polarized light FPR-R.

For example, in the case of the display device DD of an embodiment including the first phase retardation part PT1 and the second phase retardation part PT2 having optical axes orthogonal to each other, the display device DD simultaneously emits light circularly polarized in different directions through the first phase retardation part PT1 and the second phase retardation part PT2, or simultaneously receives light polarized in different directions through the first phase retardation part PT1 and the second phase retardation part PT2, so that light distorted in each of the first phase retardation part PT1 and the second phase retardation part PT2 may be cancelled each other out. Accordingly, the display device DD of an embodiment including a pattern optical layer FPR having a first phase retardation part PT1 and a second phase retardation part PT2, which may be arranged and patterned, may provide an image with improved image quality or may capture an image without deterioration and distortion.

The display device of an embodiment may arrange a pattern optical layer FPR including a first phase retardation part PT1 and a second phase retardation part PT2 having optical axes orthogonal to each other at a portion overlapping an electronic part EM that captures an image in the direction of the front surface FS (see FIG. 1), so that the image quality captured by the electronic part can be improved. In particular, consider a case that the display device DD of an embodiment may be used in front of an electronic device ED including a polarizing plate on the front surface as shown in FIG. 1. By arranging a pattern optical layer FPR including a first phase retardation part PT1 and a second phase retardation part PT2 having optical axes orthogonal to each other at a portion overlapping the electronic part EM that captures an image in the direction of the front surface FS (see FIG. 1), problems such as rainbow mura or color shift of an image captured by the electronic part EM may be improved. For example, the display device DD of an embodiment includes a pattern optical layer FPR having two phase retardation parts patterned to have optical axes in directions orthogonal to each other, and thus may exhibit improved image quality characteristics and excellent capture quality.

In the display device of an embodiment, in case that the area on the plane of the first phase retardation part and the second phase retardation part is substantially the same, picture quality distortion occurring in one of the first phase retardation part and the second phase retardation part may be cancelled out by an opposite distortion phenomenon in the other one of the first and second phase retardation parts, so that it may be possible to exhibit better image quality characteristics.

Figure 10:
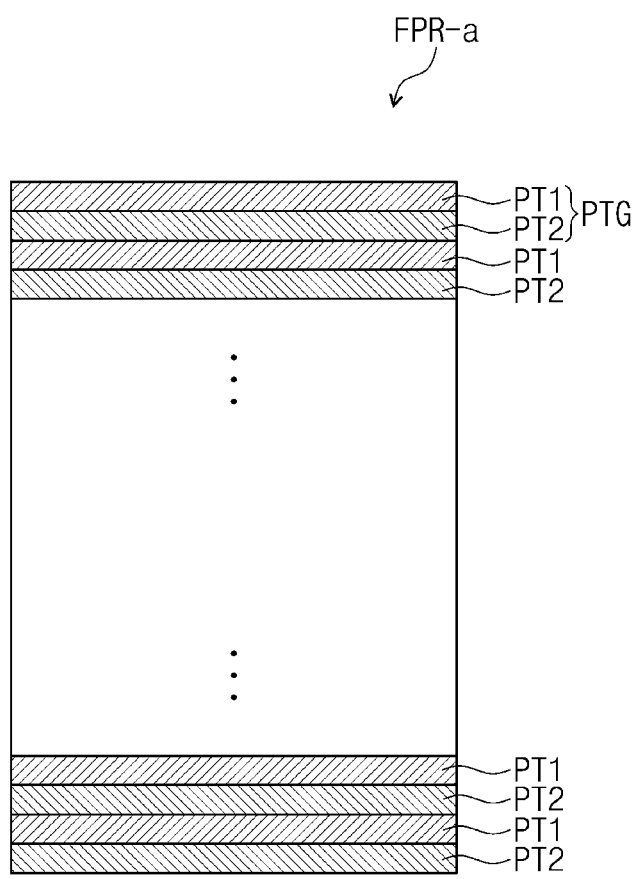
FIG. 10 is a schematic plan view illustrating a pattern optical layer according to an embodiment.
Figure 10:
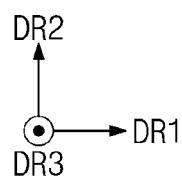
Figure 11:
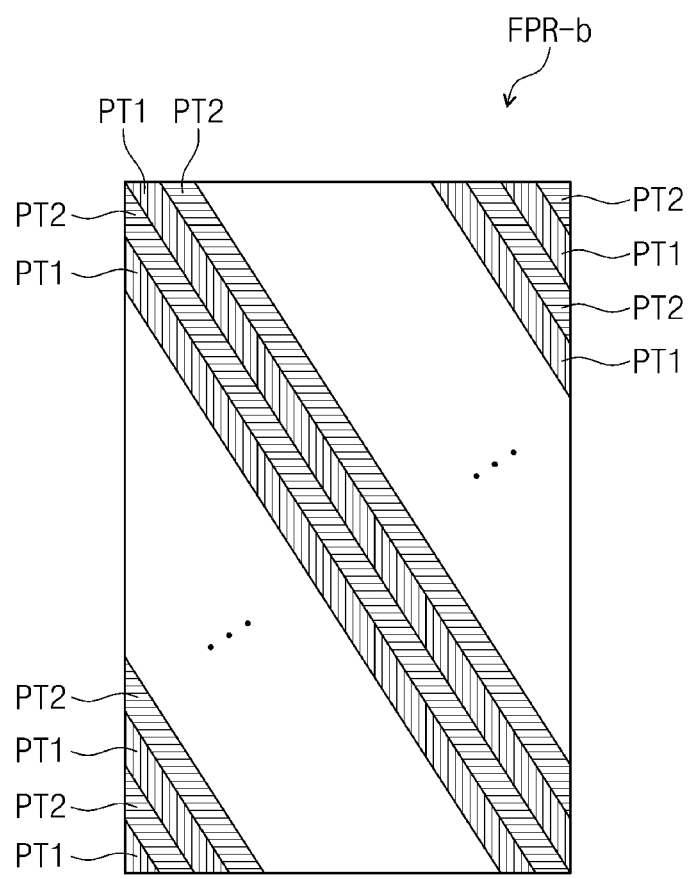
FIG. 11 is a schematic plan view illustrating a pattern optical layer according to an embodiment.
Figure 11:
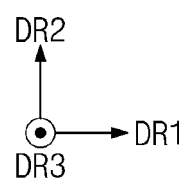
Figure 12:
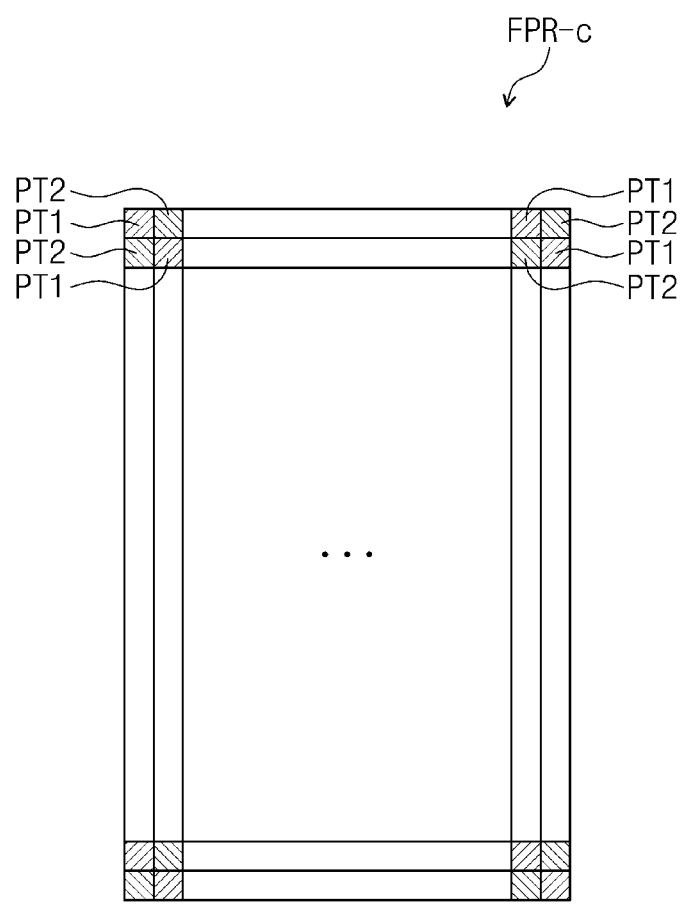
FIG. 12 is a schematic plan view illustrating a pattern optical layer according to an embodiment.

FIGS. 10 to 12 are schematic plan views each showing a pattern optical layer according to an embodiment. FIGS. 10 to 12 illustrate a pattern shape of a pattern optical layer by way of example, and embodiments are not limited to the examples shown.

FIG. 10 shows a pattern optical layer FPR-a including first phase retardation parts PT1 and second phase retardation parts PT2 arranged in a stripe shape. In an embodiment, each of the first phase retardation parts PT1 and the second phase retardation parts PT2 may extend in a direction parallel to the first direction axis DR1 and may be alternately and repeatedly arranged in a direction of the second direction axis DR2. One first phase retardation part PT1 and one second phase retardation part PT2 may be divided into one pattern group PTG, and in each pattern group PTG, the first phase retardation part PT1 and the second phase retardation part PT2 may have the same area on a plane. The areas of the first phase retardation parts PT1 and the areas of the second phase retardation parts PT2 included in different pattern groups PTG selected from the pattern groups PTGs may be different. However, even in this case, the total area of the first phase retardation parts PT1 and the total area of the second phase retardation parts PT2 in the entire pattern optical layer FPR-a may be the same.

FIG. 11 shows a pattern optical layer FPR-b including the first phase retardation parts PT1 and the second phase retardation parts PT2 patterned to extend in a diagonal direction on the plane defined by the first direction axis DR1 and the second direction axis DR2.

FIG. 12 illustrates a pattern optical layer FPR-c including first phase retardation parts PT1 and second phase retardation parts PT2 arranged in a mosaic pattern. In an embodiment, each of the first phase retardation parts PT1 and the second phase retardation parts PT2 may have a rectangular shape on a plane. Each of the first and second phase retardation parts PT1 and PT2 may have a rectangular or square shape. In a pattern optical layer FPR-c according to an embodiment including the first and second phase retardation parts PT1 and PT2 arranged in a mosaic pattern, the second phase retardation part PT2 may be disposed in a portion adjacent to the first phase retardation part PT1, and the first phase retardation parts PT1 having an optical axis in the same direction may be disposed to be spaced apart from each other.

Even in each of the pattern optical layers FPR-b and FPR-c according to an embodiment shown in FIGS. 11 and 12, the total area of the first phase retardation parts PT1 and the total area of the second phase retardation parts PT2 may be the same.

As a display device according to an embodiment may include the pattern optical layer according to an embodiment described above, in case capturing an image using an electronic part under the polarizing part, excellent capture quality can be obtained by minimizing optical interference and correcting color shift.

Referring to FIGS. 3 and 4 again, the display device DD according to an embodiment may include a panel support part OP disposed under the display part DM. The panel support part OP may include a polymer film PF. The polymer film PF may be an optically transparent polyethylene terephthalate (PET) film.

The panel support part OP may further include an adhesive layer AP4 disposed between the display part DM and the polymer film PF. The adhesive layer AP4 may be an optically transparent adhesive layer.

The polymer film PF may have a very small phase retardation or a very high phase retardation. The polymer film PF may be a non-elongated polyethylene terephthalate (PET) film having a small difference in refractive index in two orthogonal axial directions, or may be an elongated polyethylene terephthalate (PET) film whose elongation rate in one axial direction may be significantly greater than that in the other orthogonal direction.

The display device DD of an embodiment may include a support part SP disposed under the panel support part OP. The support part SP may include a cushion layer CM and a metal support layer MP. The support part SP may further include one or more adhesive layers AP5 and AP6.

A through hole HH may be defined in the support part SP. The through hole HH may be defined to pass through the cushion layer CM and the metal support layer MP. The through hole HH may be defined identically by penetrating the adhesive layers AP5 and AP6 included in the support part SP.

The through hole HH may be defined to be disposed in the active area AA of the display part DM. In the display device DD, the first area HA-EP may be disposed in the active area AA of the display part DM corresponding to the through hole HH. The film hole area HA-OP of the panel support part OP and the polarization hole area HA-P of the polarizing part PM may also correspond to the through hole HH.

The cushion layer CM may be provided to protect the display part DM, the electronic part EM, and the like against a physical shock applied from outside of the display device DD. The cushion layer CM may be provided with a thickness or more in order to implement the through hole HH. The thickness of the cushion layer CM may be about 50 μm or more. For example, the thickness of the cushion layer CM may be about 100 μm or more.

The cushion layer CM may be formed by including at least one of an acrylic polymer, a urethane polymer, a silicone polymer, and an imide polymer. The cushion layer CM may have strength to protect the display part DM, the electronic part EM, and the like, and to define the through hole HH.

An adhesive layer AP5 may be further disposed above the cushion layer CM. The adhesive layer AP5 may bond the cushion layer CM and the panel support part OP.

The metal support layer MP may be a support substrate supporting members included in the display device DD such as the display part DM. The metal support layer MP may be a thin metal substrate. The metal support layer MP may have functions such as heat dissipation or electromagnetic wave shielding.

In FIG. 4 and the like, the metal support layer MP that may be included in the support part SP is illustrated as one layer, but embodiments are not limited thereto, and the support part SP may include stacked metal support layers. An adhesive layer may be further provided between the metal support layers.

The electronic part EM may be disposed under the display part DM. The electronic part EM may overlap the through hole HH. The electronic part EM may receive an external input transmitted through the through hole HH or may provide an output through the through hole HH. In an embodiment, the electronic part EM may be a camera.

A window WM, a polarizing part PM, a display part DM, and a panel support part OP may be disposed on the electronic part EM. The display device DD according to an embodiment may optimize the relationship between the optical axis and the phase difference value of the polarizing plate POL and the pattern optical layer FPR disposed on the electronic part EM so that in case using the electronic part EM, optical interference and light distortion caused by the window WM, the polarizing part PM, the display part DM, and the panel support part OP can be minimized.

The display device DD of an embodiment may allow the phase difference of the protective layer PL of the window WM to be an ultra-high phase difference, and optimize the relationship between the optical axis and the phase retardation value of the polarizing plate POL and the pattern optical layer FPR, so that in case that the electronic part EM may be used, light distortion and color shift caused by the window WM, the polarizing part PM, the display part DM, and the panel support part OP may be minimized. For example, as the display device DD of an embodiment includes a pattern optical layer FPR with two phase retardation parts PT1 and PT2 that allow the phase difference of the protective layer PL to be an ultra-high phase difference, have an optical axis orthogonal to each other, and have a λ4 phase delay value, so that capture quality with improved rainbow mura phenomenon and color shift can be shown.

Hereinafter, a display device according to an embodiment will be described with reference to FIGS. 13 to 16. In the description of FIGS. 13 to 16, contents overlapping with those described in FIGS. 1 to 12 and the like described above will not be described again, and differences will be described.

Figure 13:
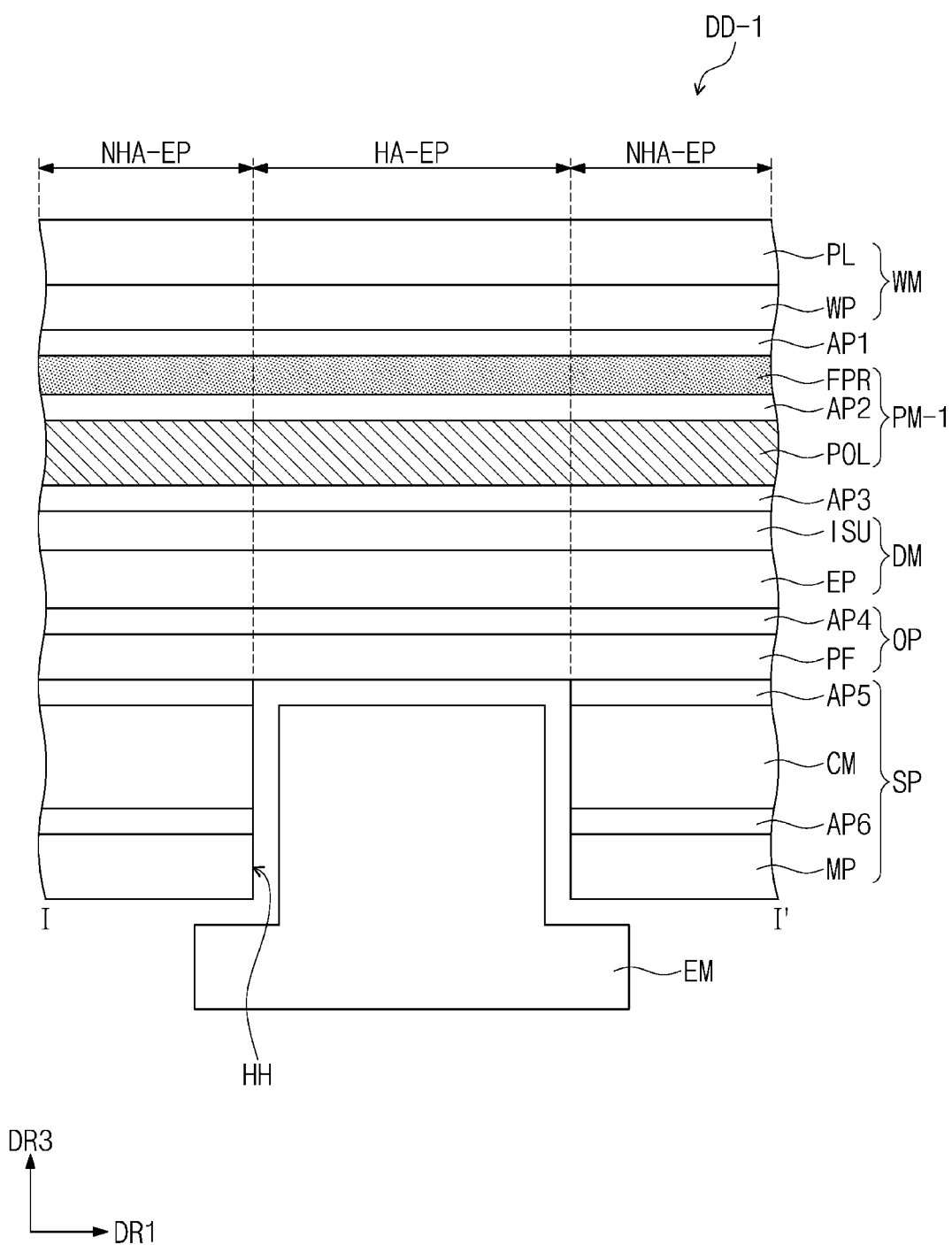
FIG. 13 is a schematic cross-sectional view of a part of a display device according to an embodiment.
Figure 14:
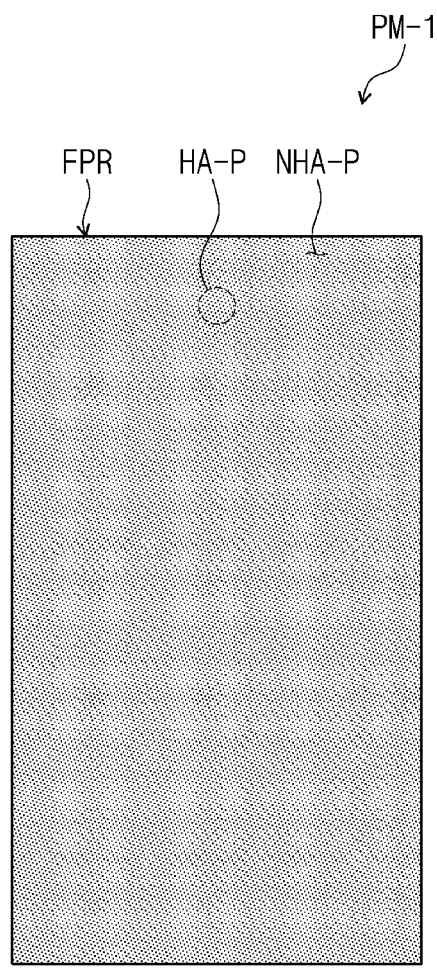
FIG. 14 is a schematic plan view showing a polarizing part according to an embodiment.

FIG. 13 is a schematic cross-sectional view illustrating a display device of an embodiment. FIG. 14 is a schematic plan view showing a polarizing part according to an embodiment.

The display device DD-1 of an embodiment may include a display part DM, a polarizing part PM-1 and a window WM disposed above the display part DM, and a panel support part OP and a support part SP disposed below the display part DM. At least a part of the electronic part EM may be disposed in the through hole HH defined in the support part SP.

The display device DD-1 of the embodiment illustrated in FIG. 13 may be different from the display device DD of the embodiment described in FIGS. 4 and 5 in the configuration of the polarizing part PM-1. In the display device DD-1 of an embodiment, the polarizing part PM-1 may include a polarizing plate POL and a pattern optical layer FPR. The pattern optical layer FPR may overlap the entire first area HA-EP and second area NHA-EP of the display part DM. For example, unlike the display device DD of the embodiment described with reference to FIGS. 4 and 5, the pattern optical layer FPR may be provided to overlap the entire display part DM, not only the first area HA-EP. For example, the polarizing part PM-1 according to an embodiment may include a polarizing plate POL and a pattern optical layer FPR overlapping the entire polarizing plate POL.

The contents of the pattern optical layer described with reference to FIGS. 6 to 12 may be equally applied to the pattern optical layer FPR in the embodiment described in FIGS. 13 and 14. For example, in the polarizing part PM-1 according to an embodiment, the pattern optical layer FPR may include first phase retardation parts and second phase retardation parts having optical axes orthogonal to each other, and the first phase retardation parts and the second phase retardation parts may be alternately and repeatedly arranged on a plane. Each of the first phase retardation parts and the second phase retardation parts may be a λ/4 phase retarder.

Figure 15:
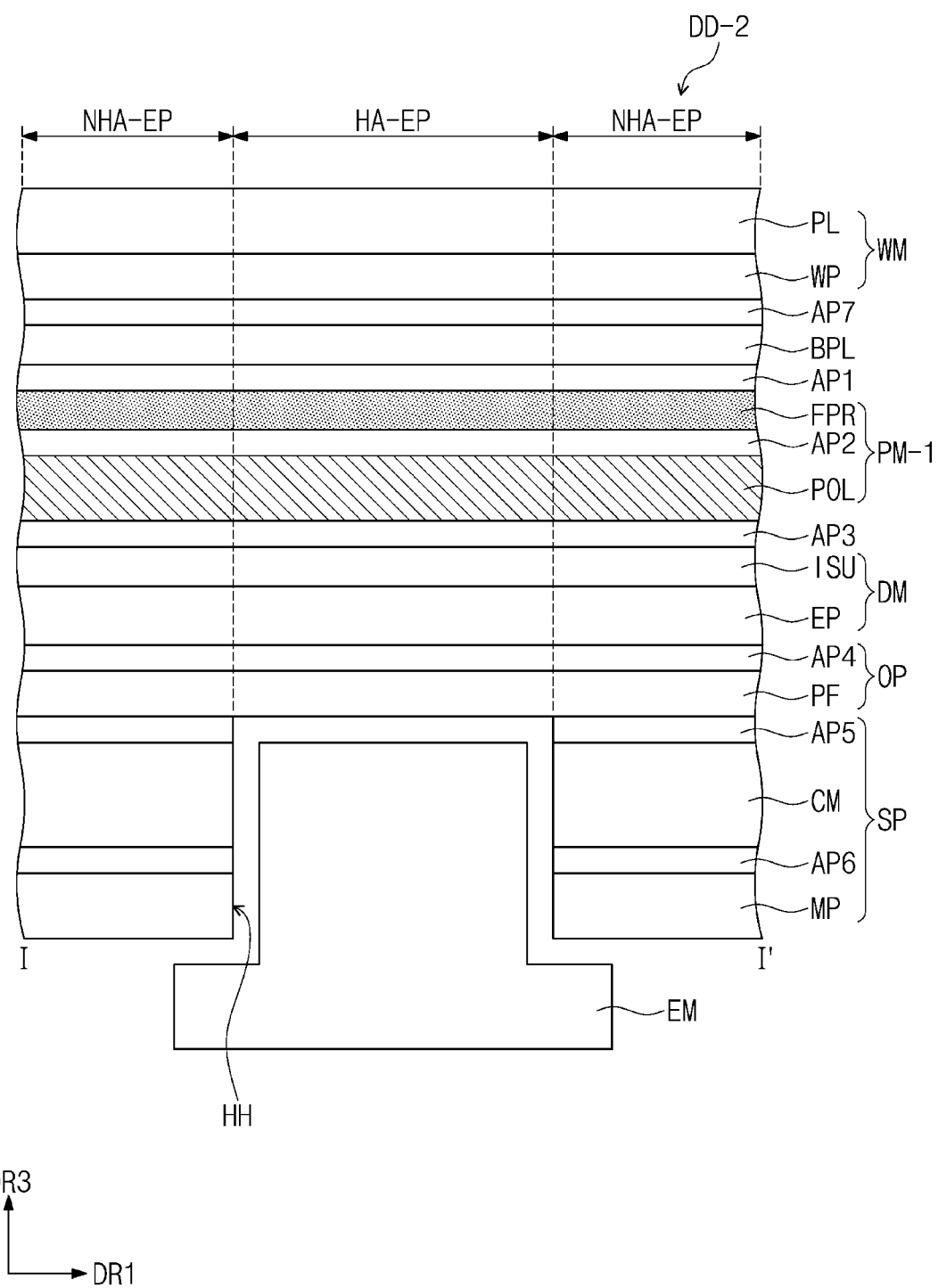
FIG. 15 is a schematic cross-sectional view of a part of a display device according to an embodiment.

The display device DD-2 of an embodiment illustrated in FIG. 15 may further include a shock absorbing layer BPL compared to the display device DD-1 of an embodiment illustrated in FIG. 13. The shock absorbing layer BPL may be disposed between the polarizing part PM-1 and the window WM.

The shock absorbing layer BPL may be a layer having a phase difference of about 5000 nm or more. For example, in an embodiment, the phase difference of the shock absorbing layer BPL may be about 8000 nm or more. In an embodiment, the shock absorbing layer BPL may include a polymer film having a high phase difference value. In an embodiment, as the phase difference of the shock absorbing layer BPL may be about 5000 nm or more, rainbow mura phenomenon caused by functional layers of the display device DD-2 may be further improved.

The display device DD-2 of an embodiment may further include an adhesive layer AP7 disposed between the shock absorbing layer BPL and the window WM to couple the shock absorbing layer BPL and the window WM.

FIG. 15 shows that the pattern optical layer FPR may overlap both the first area HA-EP and the second area NHA-EP of the display part DM, but the embodiment is not limited thereto, and in the display device DD-2 of an embodiment, the pattern optical layer FPR may overlap the first area HA-EP and non-overlap the second area NHA-EP.

Figure 16:
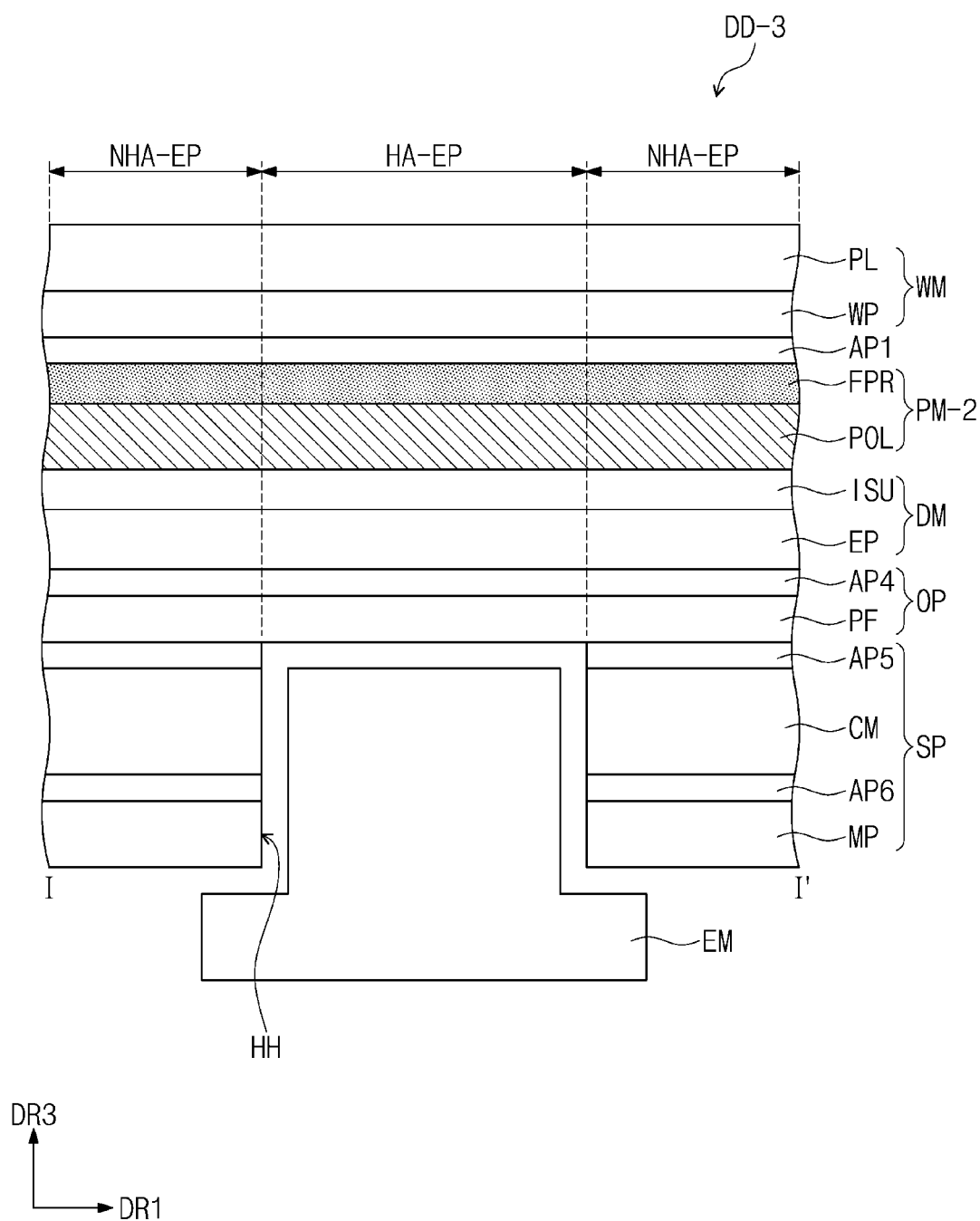
FIG. 16 is a schematic cross-sectional view of a part of a display device according to an embodiment.

The display device DD-3 of an embodiment illustrated in FIG. 16 may be different from the display device DD-1 of an embodiment illustrated in FIG. 13 in that the adhesive layers AP2 and AP3 may be omitted. In the display device DD-3 of an embodiment, the polarizing plate POL may be directly disposed on the display part DM. The pattern optical layer FPR may be directly disposed on the polarizing plate POL. On the other hand, unlike what is shown in the drawing, only one of the adhesive layers disposed between the polarizing plate POL and the display part DM and between the pattern optical layer FPR and the polarizing plate POL may be omitted.

In case that the polarizing plate POL is directly disposed on the display part DM, the polarizing plate POL may be provided in the form of a coating layer directly coated on the display part DM. In case that the pattern optical layer FPR is directly disposed on the polarizing plate POL, the pattern optical layer FPR may be provided in the form of a coating layer directly coated on the polarizing plate POL.

FIG. 16 shows that the pattern optical layer FPR overlaps both the first area HA-EP and the second area NHA-EP of the display part DM, but the embodiment is not limited thereto, and in the display device DD-3 of an embodiment, the pattern optical layer FPR may overlap the first area HA-EP and non-overlap the second area NHA-EP.

The contents of the pattern optical layer described with reference to FIGS. 6 to 12 may be equally applied to the pattern optical layer FPR in the embodiment described in FIGS. 15 and 16. For example, in the polarizing part PM-1 and PM-2 according to an embodiment, the pattern optical layer FPR includes first phase retardation parts and second phase retardation parts having optical axes orthogonal to each other, and the first phase retardation parts and the second phase retardation parts may be alternately and repeatedly arranged on a plane. Each of the first phase retardation parts and the second phase retardation parts may be a λ/4 phase retarder.

As the display device of an embodiment may include two phase retardation parts patterned to have optical axes perpendicular to each other in a polarizing part disposed on an electronic part, optical interference and optical distortion caused by members disposed on the electronic part can be minimized. The display device of an embodiment may include a pattern optical layer that may be disposed on an electronic part and have two patterned phase retardation parts converting circularly polarized light in different directions, so that excellent image quality and good capture quality can be displayed by canceling the color shift due to the light distortion phenomenon.

An embodiment includes a pattern optical layer including two phase retardation parts disposed on a polarizing plate and having an optical axis perpendicular to each other, so that a display device with improved image quality captured by a camera can be provided.

As the display device of an embodiment may include, in a polarizing part disposed on the electronic part, a polarizing plate and a pattern optical layer having two phase retardation parts that may circularly polarize light in different directions, excellent capture quality can be displayed using the camera placed in the active area even in case self-capturing in front of an electronic device.

Although the embodiments have been described, it is understood that the embodiments should not be limited to these embodiments but various changes and modifications can be made by one ordinary skilled in the art within the spirit and scope of the inventive concept as claimed.

What is claimed is:

1. A display device comprising:
an electronic part;
a support part including a through hole overlapping the electronic part;
a display part disposed above the support part and including:
a first area overlapping the through hole; and
a second area non-overlapping the through hole, the second area being adjacent to the first area;
a polarizing plate disposed above the display part and having a transmission axis parallel to a direction; and
a pattern optical layer disposed on the polarizing plate and including:
first phase retardation parts having a first optical axis; and
second phase retardation parts having a second optical axis orthogonal to the first optical axis, wherein the pattern optical layer does not overlap the second area.

2. The display device of claim 1, wherein
the first optical axis has an intervening angle of about 45±5° in a positive direction with respect to the transmission axis, and
the second optical axis has an intervening angle of about 45±5° in a negative direction with respect to the transmission axis.

3. The display device of claim 1, wherein the pattern optical layer is a λ/4 phase retarder.

4. The display device of claim 1, wherein the pattern optical layer overlaps the first area.

5. The display device of claim 1, wherein the first phase retardation parts and the second phase retardation parts are alternately arranged.

6. The display device of claim 5, wherein a total area of the first phase retardation parts and a total area of the second phase retardation parts are the same.

7. The display device of claim 5, wherein each of the first phase retardation parts and the second phase retardation parts is arranged in a stripe shape.

8. The display device of claim 7, wherein each of the first phase retardation parts and the second phase retardation parts is arranged to be parallel to or orthogonal to the direction.

9. The display device of claim 5, wherein
each of the first phase retardation parts and the second phase retardation parts has a square shape in a plan view, and
the first phase retardation parts and the second phase retardation parts are arranged in a mosaic shape.

10. The display device of claim 1, wherein
the polarizing plate comprises:
a linear polarizing layer;
a first phase retardation layer disposed under the linear polarizing layer; and
a second phase retardation layer disposed between the first phase retardation layer and the linear polarizing layer, and
the first phase retardation layer is a λ/4 phase retarder, and the second phase retardation layer is a λ/2 phase retarder.

11. The display device of claim 1, further comprising a window including:
a cover layer; and
a protective layer disposed on the cover layer and having a phase retardation of about 5000 nm or more.

12. The display device of claim 1, further comprising a shock absorbing layer disposed on an upper side of the pattern optical layer and having a phase retardation of about 5000 nm or more.

13. The display device of claim 1, wherein the polarizing plate is directly disposed on the display part.

14. The display device of claim 1, wherein the pattern optical layer is directly disposed on the polarizing plate.

15. A display device comprising:
a display part;
a camera disposed below the display part and capturing an image in a front direction of the display part;
a polarizing plate disposed above the display part and including a linear polarizing layer having a transmission axis in a direction; and
a pattern optical layer overlapping the camera and disposed above the polarizing plate, the pattern optical layer including:
first phase retardation parts having a first optical axis; and
second phase retardation parts having a second optical axis orthogonal to the first optical axis, wherein
the display part includes a first area overlapping the camera, and a second area adjacent too the first area, and
the pattern optical layer does not overlap the second area.

16. The display device of claim 15, wherein
the first optical axis has an intervening angle of about 45±5 degrees in a positive direction with respect to the transmission axis, and
the second optical axis has an intervening angle of about 45±5 degrees in a negative direction with respect to the transmission axis.

17. The display device of claim 15, wherein the pattern optical layer is a λ/4 phase retarder.

18. The display device of claim 15, wherein the first phase retardation parts and the second phase retardation parts are alternately arranged.

19. The display device of claim 15, wherein a total area of the first phase retardation parts and a total area of the second phase retardation parts are the same.

* * * * *